(12) United States Patent
Asami

(10) Patent No.: US 6,850,545 B2
(45) Date of Patent: Feb. 1, 2005

(54) WAVELENGTH TUNABLE LIGHT SOURCE

(75) Inventor: Keisuke Asami, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 46 days.

(21) Appl. No.: 10/008,448

(22) Filed: Dec. 7, 2001

(65) Prior Publication Data

US 2004/0013138 A1 Jan. 22, 2004

(30) Foreign Application Priority Data

Dec. 21, 2000 (JP) .................................... P2000-389178

(51) Int. Cl.[7] .............................. H01S 3/10; H01S 3/08
(52) U.S. Cl. ........................... 372/20; 372/99; 372/102
(58) Field of Search ............................ 372/20, 99–102, 372/9, 107

(56) References Cited

U.S. PATENT DOCUMENTS

| | | | |
|---|---|---|---|
| 5,319,668 A | | 6/1994 | Luecke |
| 5,568,337 A | * | 10/1996 | Eguchi et al. ............ 360/78.11 |
| 5,594,744 A | | 1/1997 | Lefevre et al. |
| 6,061,323 A | * | 5/2000 | Jerman et al. ............ 369/13.32 |
| 6,076,256 A | * | 6/2000 | Drake et al. .................. 29/825 |
| 6,275,454 B1 | * | 8/2001 | Boutaghou et al. ...... 369/44.19 |
| 6,292,447 B1 | * | 9/2001 | Takishima et al. ........ 369/53.25 |
| 6,295,306 B1 | * | 9/2001 | Asami .......................... 372/20 |
| 6,333,910 B1 | * | 12/2001 | Nishikawa et al. .......... 369/119 |
| 6,434,173 B1 | * | 8/2002 | Tuganov et al. ................ 372/9 |
| 2001/0036218 A1 | * | 11/2001 | Funakawa .................... 372/102 |
| 2002/0024979 A1 | * | 2/2002 | Vilhelmsson et al. ......... 372/20 |

FOREIGN PATENT DOCUMENTS

| | | |
|---|---|---|
| EP | 0 921 614 A1 | 9/1998 |
| JP | 11-40883 | 2/1999 |

* cited by examiner

Primary Examiner—Don Wong
Assistant Examiner—Hung Tran Vy
(74) Attorney, Agent, or Firm—Fish & Richardson P.C.

(57) ABSTRACT

There is provided a wavelength tunable light source 10 in which one end surface 1a of a semiconductor laser 1 is applied anti-reflection film, a lens 6 collimates a light beam emitted from the one end surface 1a of the semiconductor laser 1 onto which the anti-reflection film is applied, and a wavelength selection portion constituted by a combination of a diffraction grating 2 and a mirror 3 selects a light beam having a desired wavelength to return the selected light to the semiconductor laser 1 to make laser oscillation. A center of rotation of the mirror 3 is provided in a position P0 where mode hopping can be suppressed when the wavelength is tuned and rotation of the mirror 3 is driven by a direct drive system by using a motor 4 having a rotation shaft 4a in the center of rotation of the mirror 3.

7 Claims, 4 Drawing Sheets

SERVO MOTOR

STEPPING MOTOR

WAVELENGTH TUNABLE LIGHT SOURCE

BACKGROUND OF THE INVENTION

1. Filed of the Invention

The present invention relates to a wavelength tunable light source used in the field of light-coherent communication/measuring techniques or the like.

2. Description of the Related Art

Referring to FIG. 6, a wavelength tunable light source according to a related art will be described.

In FIG. 6, reference numeral 1 denotes a semiconductor laser (hereinafter abbreviated to LD), reference numeral 2 denotes a diffraction grating, reference numeral 3 denotes a mirror, reference numerals 5, 6, and 7 denote lenses, reference numeral 8 denotes an optical isolator, reference numeral 11 denotes an optical fiber, and reference numeral 21 denotes a motor.

An anti-reflection film is applied onto one end surface 1a (diffraction grating 2 side end surface) of the LD 1 to avoid Fabry-Perot resonance between the end surface 1a and the other end surface 1b of the LD 1. A light beam emitted from the end surface 1a applied the anti-reflection film is converted into a collimated light beam by the lens 6 and then the collimated light beam is incident on the diffraction grating 2. Then, among the light beams incident on the diffraction grating 2, only a light beam having a wavelength selected by a wavelength selection portion constituted by a combination of the diffraction grating 2 and the mirror 3 returns to the LD 1. That is, the end surface 1b of the LD 1 and the mirror 3 form an external resonator to make laser oscillation with the wavelength selected by the wavelength selection portion.

On the other hand, a light beam emitted from the other end surface 1b of the LD 1 is converted into a collimated light beam by the lens 5 to pass through the optical isolator 8. The collimated light beam is condensed by the lens 7 to be taken out as an output light beam by the optical fiber 11. In the wavelength tunable light source, the mirror 3 itself is rotated by the motor 21 so that the wavelength which is to be selected by the wavelength selection portion, that is, the wavelength which is subjected to laser oscillation is changed.

In the wavelength tunable light source shown in FIG. 6, however, mode hopping (instantaneous wavelength jumping caused by hopping of a longitudinal mode of a resonator into an adjacent longitudinal mode) occurred when the wavelength was tunable. Hence, continuous wavelength scanning could not be made. This caused a problem that a long time was required for measuring various kinds of characteristics concerning wavelength such as wavelength loss characteristic and the like.

For example, a Littman-configuration wavelength tunable light source shown in FIGS. 7 and 8 is known as a wavelength tunable light source to solve the aforementioned problem. In the wavelength tunable light source, the center of rotation of a mirror 3 is disposed at a specific point (where the resonator length changes in accordance with the selected wavelength so that the order of the longitudinal mode does not change when the mirror 3 is rotated to tune the selected wavelength) to suppress the occurrence of mode hopping. In the Littman-configuration wavelength tunable light source, in order to increase wavelength tunable resolution, there is generally used a system in which the mirror 3 is attached to a rotary arm 22 having the center of rotation at the aforementioned specific point and a position (a forward end portion of the rotary arm 22) at a distance of tens of millimeters to 100 mm from the center of rotation of the mirror 3 is pressed by a direct-drive motor 23.

In the Littman-configuration wavelength tunable light source shown in FIGS. 7 and 8, however, backlash, stick slip, or the like, occurred in screws or gears used in the inside of the direct-drive motor 23. For this reason, there was a problem that even when the rotation shaft of the motor portion rotated, the necessary mirror 3 could not rotate or might be worse in precision of reproducibility.

Moreover, when a stepping motor was used as the motor portion of the direct-drive motor 23, torque fluctuation or velocity fluctuation (see FIG. 3(b)) was theoretically generated in every basic steps. Hence, it was difficult to estimate wavelength (position) information in wavelength scanning.

The necessity of measuring characteristics of various kinds of optical parts such as wavelength loss characteristic more speedily and more accurately has risen with the advance of the popularization of dense wavelength division multiplexing (DWDM) in the field of optical communication in recent years. Defective accuracy in wavelength or defective reproducibility caused by such slight torque or velocity fluctuation in wavelength scanning has become a subject of discussion.

SUMMARY OF THE INVENTION

An object of the present invention is to provide a wavelength tunable light source in which various kinds of characteristics concerning wavelength such as wavelength loss characteristic and the like can be measured speedily and accurately.

In order to solve the above problem, according to a first aspect of the present invention, for example, as shown in FIG. 1, there is provided a wavelength tunable light source 10 in which one of end surfaces of a semiconductor laser 1 is applied to an ant-reflection film, a lens 6 for collimating light made to exit from the one end surface of the semiconductor laser through the anti-reflection film, a wavelength selection portion constituted by a combination of a diffraction grating 2 and a mirror 3 for selecting light with a desired wavelength and returning the selected light to the semiconductor laser to thereby make laser oscillation, a center of rotation of the mirror is provided in a position P0 where mode hopping can be suppressed when the wavelength is tuned, and rotation of the mirror is driven by a direct drive system by using a motor 4 having a rotation shaft 4a in the center of rotation of the mirror.

According to the first aspect of the present invention, the center of rotation of the mirror is provided in a position where mode hopping can be suppressed when the wavelength is tuned, and the rotation of the mirror is driven by a direct-drive system by using the motor having the rotation shaft in the center of rotation of the mirror. Hence, backlash, stick slip, or the like, can be prevented from occurring when the wavelength is tuned, so that the wavelength accuracy and reproducibility can be improved. Moreover, mode hopping can be prevented from occurring over a wide band, so that continuous wavelength scanning can be made with little fluctuation in optical output.

Hence, various kinds of characteristics concerning wavelength such as wavelength loss characteristic can be measured speedily and accurately.

Although the center of rotation used in the Littman-configuration is typical of the position where mode hopping can be suppressed when the wavelength is tuned, the center of rotation used in another alignment (for example, the center of rotation deduced from measured data or the like) may be used as the aforementioned position. That is, any position may be used if it is the position where the resonator length changes in accordance with the selected wavelength so that the order of the longitudinal mode does not change when the mirror is rotated to tune the selected wavelength.

According to a second aspect of the present invention, in the wavelength tunable light source according to the first aspect of the invention, for example, as shown in FIG. 5, an optical branching device (for example, a beam splitter 13 or the like) is provided between the semiconductor laser 1 and the diffraction grating 2 for taking out a part of light with a wavelength selected by the wavelength selection portion, and the light taken out by the optical branching device is used as output light.

According to the second aspect of the present invention, a part of light with the wavelength selected by the wavelength selection portion is taken out as output light by the optical branching device. Hence, the spontaneous emission light component emitted from the semiconductor laser and contained in the output light can be reduced. That is, pure-wavelength light containing little spontaneous emission light can be taken out as output light.

According to a third aspect of the present invention, for example, as shown in FIG. 4, the wavelength tunable light source according to any one of the first and second aspects of the invention, is constituted by a rotary arm 9 connected to the rotation shaft 4a of the motor 4 and having a forward end portion to which the mirror 3 is attached; and a rotation quantity detecting unit (for example, an optical encoder 16 or the like) for detecting a quantity of rotation of the rotary arm.

According to the third aspect of the present invention, the quantity of rotation of the rotary arm can be controlled on the basis of the detection result of the rotation quantity detecting unit.

Hence, the position of the rotary arm can be controlled accurately, so that wavelength accuracy and reproducibility can be improved when the wavelength is tuned.

Incidentally, the preferable portion where the quantity of rotation of the rotary arm is detected is the forward end portion of the rotary arm. Hence, the resolution of the rotation quantity detecting unit can be improved.

According to a fourth aspect of the present invention, in the wavelength tunable light source according to any one of the first and second aspects of the invention, for example, as shown in FIG. 2, the motor 4 is a servo-motor containing an encoder 4b.

According to the fourth aspect of the present invention, the motor is constituted by a servo-motor containing an encoder. Hence, torque or velocity fluctuation can be prevented from occurring in wavelength scanning, so that wavelength accuracy and reproducibility can be improved.

Incidentally, the encoder is preferably a laser encoder of high resolution. Hence, position detecting accuracy can be improved by the encoder. Even in the case where the rotation of the mirror is driven by a direct drive system, desired wavelength tunable resolution can be obtained easily.

According to a fifth aspect of the present invention, in the wavelength tunable light source according to any one of the first and second aspects of the invention, the motor 4 is a voice coil motor having torque only in a rotation range which is set in advance.

According to the fifth aspect of the present invention, the motor is constituted by a voice coil motor having torque only in a predetermined rotation range, that is, only in a rotation range required for tuning the wavelength. Hence, the motor becomes inexpensive, high in torque and thin in size.

Moreover, the position of the rotary arm can be controlled accurately so that desired wavelength-tunable resolution can be obtained easily even in the case where the rotation of the mirror is driven by a direct drive system.

According to a sixth aspect of the present invention, in the wavelength tunable light source according to the third aspect of the invention, wavelength information in wavelength scanning is estimated on the basis of an output signal from the rotation quantity detecting unit.

According the sixth aspect of the present invention, wavelength information in wavelength scanning is designed to be estimated on the basis of an output signal from the rotation quantity detecting unit. Hence, the time required for estimating wavelength information in wavelength scanning is shortened. Hence, various kinds of characteristics of optical parts concerning wavelength can be measured in a short time.

According to a seventh aspect of the present invention, in the wavelength tunable light source according to the fourth aspect of the invention, wavelength information in wavelength scanning is estimated on the basis of an output signal from the encoder 4b.

According to the seventh aspect of the present invention, wavelength information in wavelength scanning is designed to be estimated on the basis of an output signal from the encoder. Hence, the time required for estimating wavelength information in wavelength scanning is shortened. Hence, various kinds of characteristics of optical parts concerning wavelength can be measured in a short time.

The present invention is not limited to the reference numerals and the drawings referred in this section.

DETAILED DESCRIPTION OF THE PREFERRED EMBODIMENTS

Embodiments of the present invention will be described below with reference to FIGS. 1 to 5.

[First Embodiment]

Figure 1:
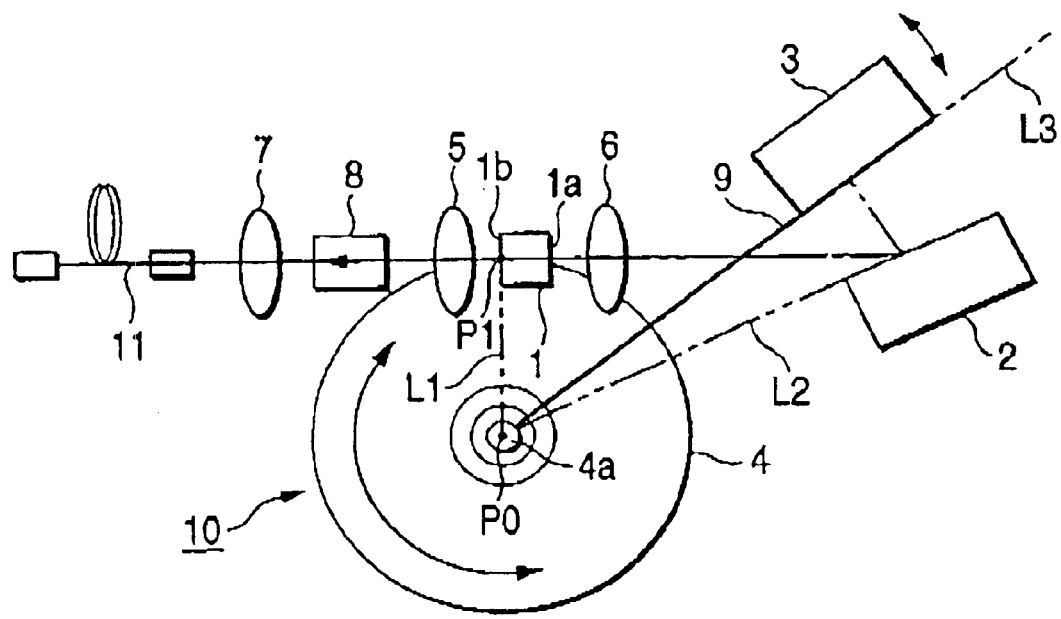
FIG. 1 is a diagram showing a schematic configuration of a wavelength tunable light source according to a first embodiment of the present invention.

FIG. 1 is a diagram showing a schematic configuration of a wavelength tunable light source according to a first embodiment of the present invention.

In this embodiment, the wavelength tunable light source 10 comprises an LD 1, a diffraction grating 2, a mirror 3, a motor 4, lenses 5, 6 and 7, an optical isolator 8, and a rotary arm 9. An anti-reflection film is applied onto an end surface 1a (diffraction grating 2 side end surface) of the LD 1.

In the wavelength tunable light source 10 shown in FIG. 1, a light beam emitted from the end surface 1a of the LD 1 is converted into a collimated light beam by the lens 6 to be incident on the diffraction grating 2. Among the light beams incident on the diffraction grating 2, only a light beam having a wavelength selected by a wavelength selection portion constituted by a combination of the diffraction grating 2 and the mirror 3 returns to the LD 1. That is, the other end surface 1b of the LD 1 and the mirror 3 constitute an external resonator to oscillate at the wavelength selected by the wavelength selection portion.

On the other hand, a light beam emitted from the other end surface 1b of the LD 1 are converted into a collimated light beam by the lens 5 pass through the optical isolator 8. Then, the collimated light beam is condensed by the lens 7 to be taken out as an output light beam by an optical fiber 11.

A rotation mechanism constituted by a combination of the rotary arm 9 and the motor 4 is further provided in the wavelength tunable light source 10 shown in FIG. 1. The mirror 3 is rotated by the rotation mechanism so that wavelength scanning can be made.

Here, the center of rotation of the mirror 3 coincides with a point P0 of intersection between line segments L1 and L2. The line segment L1 extends perpendicularly to the optical axis from an optical position P1 of the end surface 1b of the LD 1 in relation to the diffraction grating 2 (the position of the end surface 1b in relation to the diffraction grating 2 when each of lengths of the lens 6 and the LD 1 are converted in air) as a start point. The line segment L2 extends from the diffraction surface of the diffraction grating 2. Further, the mirror 3 is turned so that a line segment L3 of extension of the reflection surface of the mirror 3 is directed into a direction which passes through the point P0. Incidentally, since an offset amount between the actual end surface 1b and the optical position P1 of the end surface 1b is about several mm, FIG. 1 cannot show the offset amount precisely. Actually, the optical position P1 is several mm off in relation to the end surface 1b, toward the optical isolator side.

Such alignment of the mirror 3, diffraction grating 2 and LD 1 is called Littman-configuration. According to this alignment, mode hopping can be prevented from occurring over a wide band, so that continuous wavelength scanning can be made with little fluctuation of the light output. That is, the center of rotation of the mirror 3 is provided in a position where mode hopping can be suppressed when the wavelength is tuned.

Figure 2:
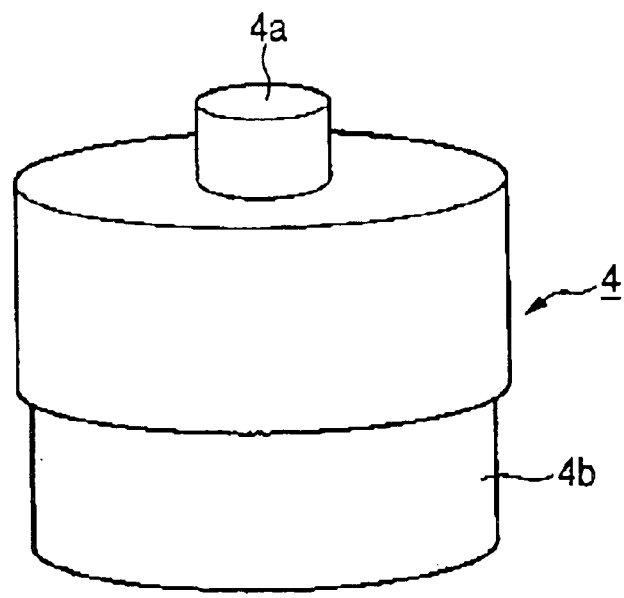
FIG. 2 is a perspective view showing a motor provided in the wavelength tunable light source shown in FIG. 1.
Figure 3:
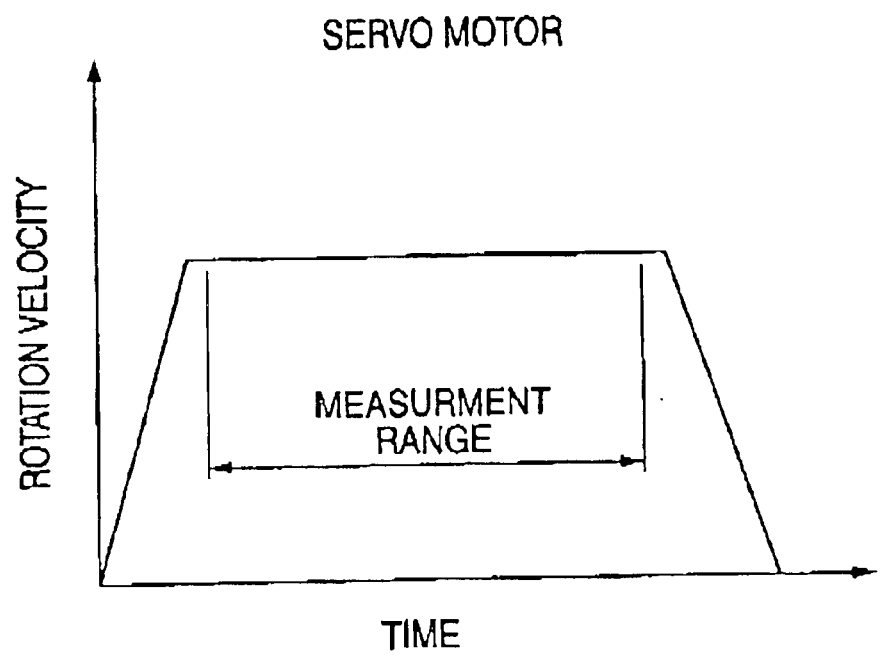
FIGS. 3(a) and 3(b) are graphs for comparing the rotation velocity characteristic of a servo-motor with that of a stepping motor.
Figure 3:
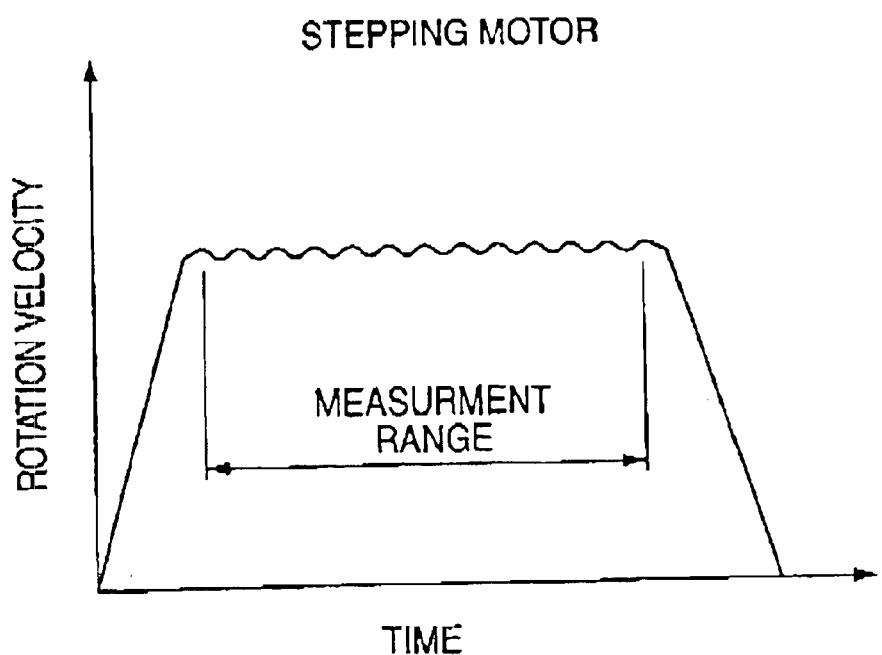

As shown in FIG. 2, the motor 4 is constituted by a servo-motor having a laser encoder of high resolution. Further, as shown in FIG. 1, a rotation shaft 4a of the motor 4 is disposed at the point P0, and a base end portion of the rotary arm 9 is connected to the rotation shaft 4a. The mirror 3 is attached to a forward end portion of the rotary arm 9 so that the mirror 3 and the rotary arm 9 rotate together with the rotation shaft 4a as the rotation shaft 4a rotates. That is, the motor 4 drives the mirror 3 to rotate in a direct drive system.

Further, a control portion not shown is electrically connected to the motor 4. The control portion performs feedback control of the motor 4 on a basis of an output signal from the encoder 4b and estimates wavelength information (current wavelength) in wavelength scanning on the basis of the output signal from the encoder 4b. Hence, torque or velocity fluctuation or the like occurring in the case of a stepping motor shown in FIG. 3(b) in wavelength scanning can be prevented, so that the time required for estimating wavelength information in wavelength scanning becomes short, as shown in FIG. 3(a).

That is, according to the wavelength tunable light source of this embodiment, the center of rotation of the mirror 3 is provided in a position where mode hopping can be suppressed when the wavelength is tuned, and the rotation of the mirror 3 is driven by the direct drive system by using the motor 4 having the rotation shaft 4a provided in the center of rotation of the mirror 3. Hence, backlash, stick slip, or the like, can be prevented from occurring when the wavelength is tuned. Hence, wavelength accuracy and reproducibility can be improved. Moreover, mode hopping can be prevented from occurring over a wide band. Hence, continuous wavelength scanning can be made with little fluctuation of the light output.

Accordingly, various kinds of characteristics concerning wavelength, such as wavelength loss characteristic, can be measured speedily and accurately.

Moreover, the motor 4 is constituted by a servo-motor having an encoder 4b. Accordingly, fluctuation in torque or velocity hardly occurs in wavelength scanning. Hence, wavelength accuracy and reproducibility can be improved. Moreover, the encoder 4b is constituted by a laser encoder. Accordingly, desired wavelength-tunable resolution can be obtained easily.

Moreover, wavelength information in wavelength scanning is estimated on the basis of the output signal from the encoder 4b. Accordingly, the time required for estimating wavelength information in wavelength scanning becomes short. Hence, various kinds of characteristics of optical parts concerning wavelength can be measured in a short time.

The present invention is not limited to the wavelength tunable light source 10 described in this embodiment and various changes or modifications may be made. For example, although this embodiment has shown the case where the motor 4 is constituted by a servo-motor, the present invention may be applied also to the case where the motor 4 is constituted by a voice coil motor having torque only in a predetermined range (such as a swing type voice coil motor which has a voice coil at one end of an arm held rotatably so that the arm is swung when the voice coil is supplied with a current). Also in this case, like the case of a servo-motor, the position of the rotary arm 9 can be controlled accurately so that desired wavelength-tunable resolution can be obtained easily.

Figure 4:
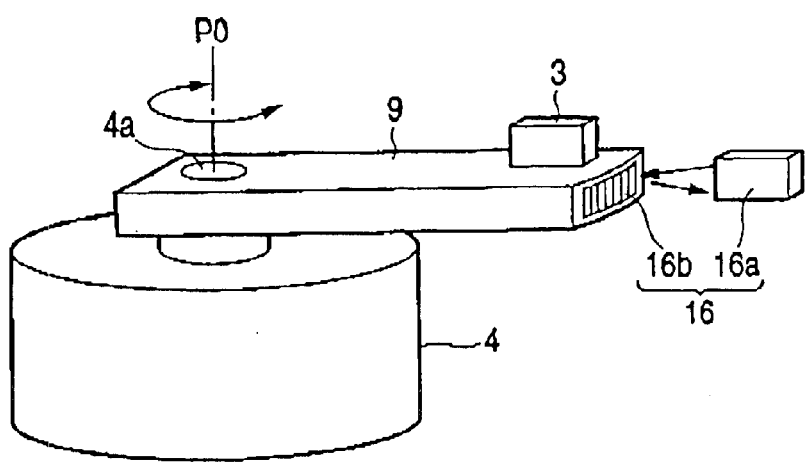
FIG. 4 is a perspective view showing an example of configuration of a rotation quantity detecting unit.

Although the first embodiment has shown the case where the motor 4 has the encoder 4b, the present invention may be applied also to the case where the motor has no encoder. In this case, rotation quantity detecting unit (external encoder) may be preferably provided for detecting the quantity of rotation of the mirror 3 or the rotary arm 9. A transmission type or reflection type optical encoder can be used as the rotation quantity detecting unit. As shown in FIG. 4, when, for example, a reflection type optical encoder 16 is used, an optical scale 16b is disposed at the forward end portion of the rotary arm 9 and a body portion 16a is disposed in a position opposite to the optical scale 16b. The body portion 16a contains a light-emitting device for irradiating light toward the optical scale 16b, and light-detection devices for detecting A-phase and B-phase rotation signals output from the optical scale 16b. The quantity of moving displacement of the body portion 16a relative to the optical scale 16b and the moving direction thereof are detected on the basis of the A-phase and B-phase rotation signals detected by the light-detection devices. By providing the rotation quantity detecting unit thus, the position of the rotary arm 9 can be controlled accurately. Hence, wavelength accuracy and reproducibility can be improved when the wavelength is tuned. By arranging the optical scale 16b in the forward end portion of the rotary arm 9, the resolution of the rotation quantity detecting unit can be improved.

[Second Embodiment]

Figure 5:
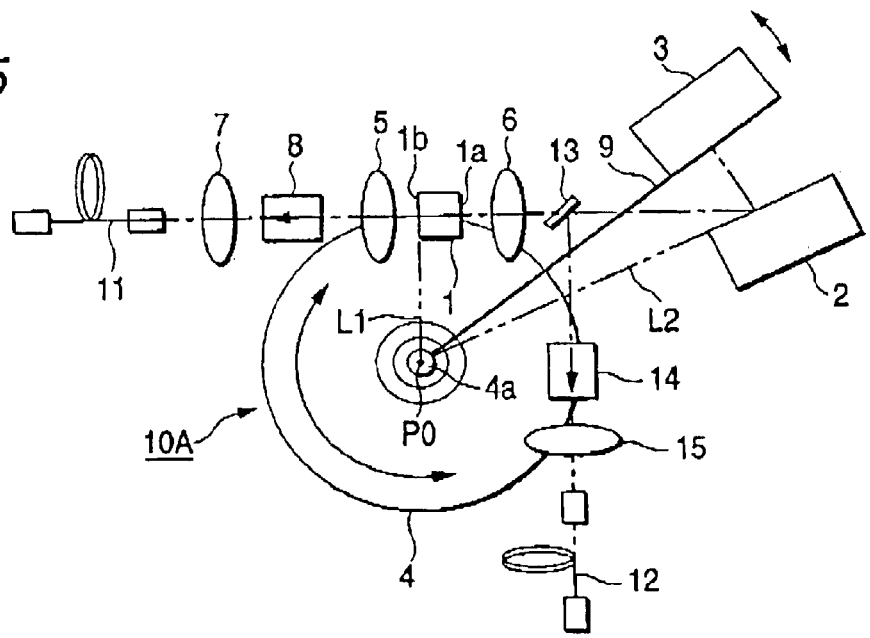
FIG. 5 is a diagram showing a schematic configuration of a wavelength tunable light source according to a second embodiment of the present invention.
Figure 6:
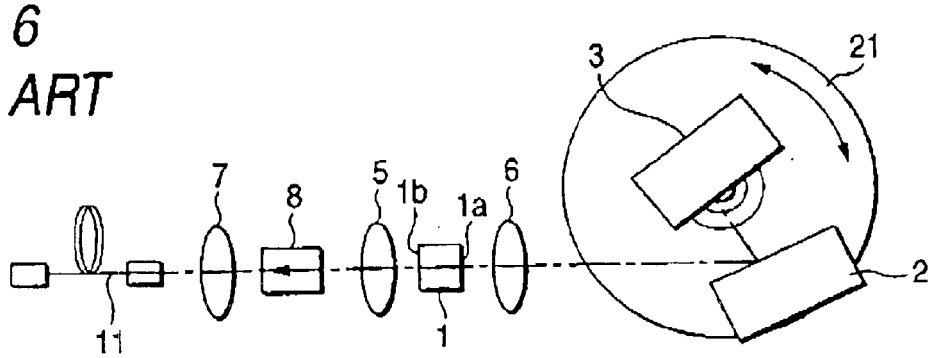
FIG. 6 is a diagram showing an example of configuration wavelength tunable light source according to a related art.
Figure 7:
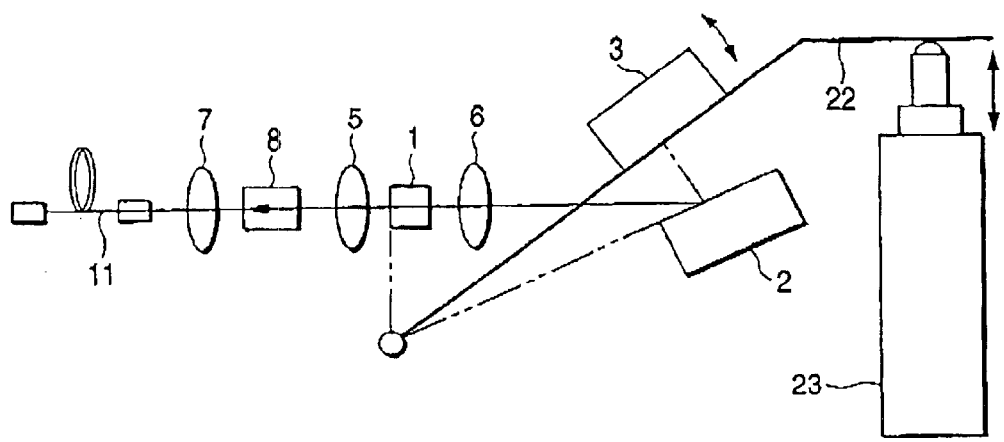
FIG. 7 is a diagram showing an example of configuration of a Littman-configuration wavelength tunable light source.
Figure 8:
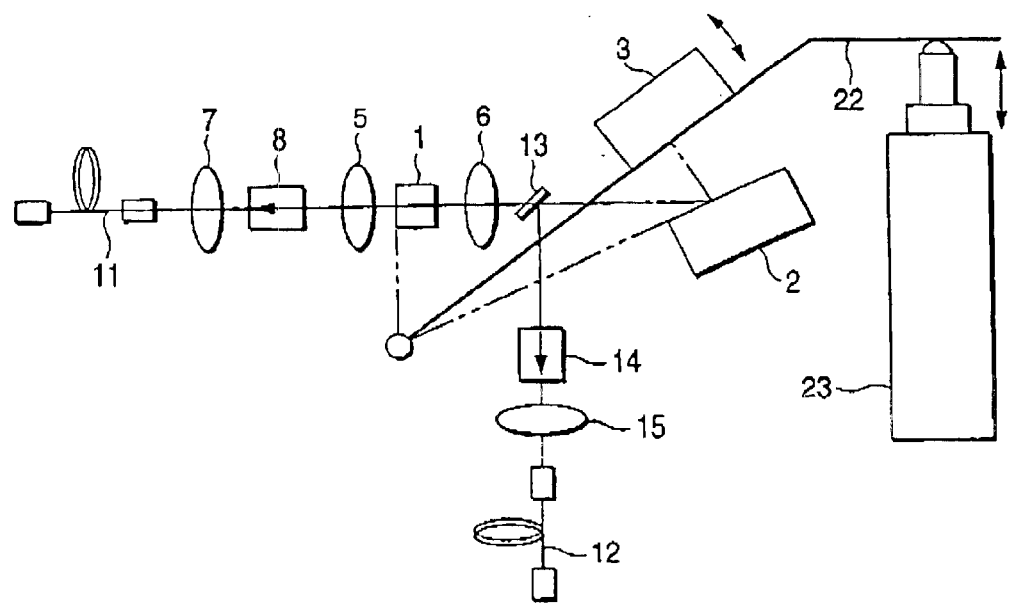
FIG. 8 is a diagram showing a modified example of the wavelength tunable light source shown in FIG. 7.

FIG. 5 is a diagram showing a schematic configuration of a wavelength tunable light source according to a second embodiment of the present invention. Except for portions peculiar to the second embodiment, the second embodiment is the same as the first embodiment. In the second embodiment, parts the same as those in the first embodiment are allotted the same references and the description of those parts will be omitted.

As shown in FIG. 5, a wavelength tunable light source 10A according to the second embodiment has a beam splitter 13 between the diffraction grating 2 and the LD 1. The beam splitter 13 is a kind of optical branching device. That is, a light beam having a wavelength selected by the wavelength selection portion is branched into two parts by the beam splitter 13. One part of the light beam returns to the LD 1 whereas the other part of the light beam is condensed by a lens 15 via an optical isolator 14 to be taken out as an output light beam by an optical fiber 12.

Hence, according to the wavelength tunable light source 10A of the second embodiment, a light beam having a pure wavelength little in spontaneous emission light component from the LD 1 can be taken out as an output light beam.

Although the second embodiment has shown the case where the beam splitter 13 is used as an optical branching device, the present invention is not limited thereto. Any optical branching device may be used in the present invention if diffracted light beam returned from the diffraction grating 2 to the LD 1 can be branched into parts so that one branched part of the light beam can be taken out as an output light beam.

It is a matter of course that various changes or modifications may be made suitably as to the specific detailed structure or the like without departing from the spirit of the present invention.

According to a first aspect of the present invention, backlash, stick slip, or the like, can be prevented from occurring when the wavelength is tuned, so that the wavelength accuracy and reproducibility can be improved. Moreover, mode hopping can be prevented from occurring over a wide band, so that continuous wavelength scanning can be made with little fluctuation in an optical output.

Hence, various kinds of characteristics concerning wavelength such as wavelength loss characteristic can be measured speedily and accurately.

According to a second aspect of the present invention, pure single spectrum light little in spontaneous emission light component from the semiconductor laser can be taken out as an output light beam.

According to a third aspect of the present invention, the position of the rotary arm can be controlled accurately, so that wavelength accuracy and reproducibility can be improved when the wavelength is tuned.

According to a fourth aspect of the present invention, torque or velocity fluctuation can be prevented from occurring in wavelength scanning, so that wavelength accuracy and reproducibility can be improved.

According to a fifth aspect of the present invention, the motor becomes inexpensive, high in torque and thin in size.

According a sixth and seventh aspects of the present invention, the time required for estimating wavelength information in wavelength scanning is shortened. Hence, various kinds of characteristics of optical parts concerning wavelength can be measured in a short time.

What is claimed is:

1. A wavelength tunable light source comprising:
   a semiconductor laser in which one of end surfaces is applied an anti-reflection film;
   a lens;
   a wavelength selection portion including a diffraction grating and a mirror; and
   a motor,
   wherein a light beam is emitted from the one of end surfaces;
   the lens collimates the light beam;
   the wavelength selection portion selects a light beam having desired wavelength from the collimated light beam to return the selected light beam to the semiconductor laser so that laser oscillation occurs;
   a center of rotation of the mirror is provided in a position where mode hopping is suppressed when a wavelength in the laser oscillation is tuned, and
   rotation of the mirror is driven by a direct drive system by using the motor having a rotation shaft in the center of rotation of the mirror.

2. The wavelength tunable light source according to claim 1, further comprising an optical branching device provided between the semiconductor laser and the diffraction grating for taking out a part of the selected light beam, wherein the light beam taken out by the optical branching device is used as an output light beam.

3. The wavelength tunable light source according to claim 1, further comprising:
   a rotary arm connected to the rotation shaft of the motor and having a forward end portion to which the mirror is attached; and
   a rotation quantity detecting unit for detecting a quantity of rotation of the rotary arm.

4. The wavelength tunable light source according to claim 3, wherein wavelength information in wavelength scanning is estimated on a basis of an output signal from the rotation quantity detecting unit.

5. The wavelength tunable light source according to claim 1, wherein the motor is a servo-motor containing an encoder.

6. The wavelength tunable light source according to claim 5, wherein wavelength information in wavelength scanning is estimated on a basis of an output signal from the encoder.

7. The wavelength tunable light source according to claim 1, wherein the motor is a voice coil motor having torque only in a rotation range which is set in advance.

* * * * *